United States Patent
Cho et al.

(10) Patent No.: US 10,622,226 B2
(45) Date of Patent: Apr. 14, 2020

(54) METHOD AND APPARATUS FOR CLEANING COMPONENT OF SUBSTRATE PROCESSING APPARATUS

(71) Applicant: SEMES CO., LTD., Chungcheongnam-do (KR)

(72) Inventors: Soon-Cheon Cho, Gyeonggi-do (KR); Bongkyu Shin, Chungcheongnam-do (KR); Byeol Han, Gyeonggi-do (KR); Hyun Joong Kim, Gyeonggi-do (KR)

(73) Assignee: SEMES CO. LTD., Chungcheongnam-Do (KR)

( * ) Notice: Subject to any disclaimer, the term of this patent is extended or adjusted under 35 U.S.C. 154(b) by 78 days.

(21) Appl. No.: 15/785,993

(22) Filed: Oct. 17, 2017

(65) Prior Publication Data

US 2018/0108546 A1    Apr. 19, 2018

(30) Foreign Application Priority Data

Oct. 19, 2016    (KR) .......................... 10-2016-0135827

(51) Int. Cl.
| | |
|---|---|
| H01L 21/67 | (2006.01) |
| H01L 21/683 | (2006.01) |
| B08B 3/10 | (2006.01) |
| B08B 7/00 | (2006.01) |
| G03F 1/82 | (2012.01) |
| H01J 37/32 | (2006.01) |
| H01L 21/3065 | (2006.01) |

(52) U.S. Cl.
CPC .......... *H01L 21/67051* (2013.01); *B08B 3/10* (2013.01); *B08B 7/0057* (2013.01); *G03F 1/82* (2013.01); *H01J 37/32495* (2013.01); *H01J 37/32623* (2013.01); *H01L 21/3065* (2013.01); *H01L 21/67086* (2013.01); *H01L 21/67103* (2013.01); *H01L 21/67109* (2013.01); *H01L 21/6831* (2013.01)

(58) Field of Classification Search
None
See application file for complete search history.

(56) References Cited

U.S. PATENT DOCUMENTS

| | | | |
|---|---|---|---|
| 6,613,692 B1 * | 9/2003 | Toshima | G03F 7/423 257/E21.255 |
| 2008/0166208 A1 * | 7/2008 | Lester | H01L 21/67051 414/217 |
| 2010/0122713 A1 * | 5/2010 | Tanaka | A23B 7/152 134/26 |

FOREIGN PATENT DOCUMENTS

| | | |
|---|---|---|
| JP | H11219928 A | 8/1999 |
| KR | 20-0342379 Y1 | 2/2004 |
| KR | 10-1153338 B1 | 6/2012 |
| KR | 20120101427 A | 9/2012 |

(Continued)

*Primary Examiner* — Eric W Golightly
(74) *Attorney, Agent, or Firm* — Carter, Deluca & Farrell LLP (57) ABSTRACT

Disclosed are an apparatus and a method for cleaning a component of a substrate dry processing apparatus. The method for cleaning a component of a substrate dry processing apparatus includes dipping the component in a cleaning solution received in a cleaning bath, generating radicals from the cleaning solution, and cleaning the component with the radicals. The component is cleaned with hydrogen radicals ($H_2^*$) and hydroxyl radicals ($OH^*$) generated from ozone water. Accordingly, it is possible to rapidly remove carbon (C) and fluorine (F) deposited on the component.

8 Claims, 5 Drawing Sheets

(56) References Cited

FOREIGN PATENT DOCUMENTS

KR     20130115099 A    10/2013
KR     20160088283 A    7/2016

* cited by examiner

FIG. 1

Before Cleaning  After Cleaning

FIG. 2

Before Cleaning  After Cleaning

METHOD AND APPARATUS FOR CLEANING COMPONENT OF SUBSTRATE PROCESSING APPARATUS

CROSS-REFERENCE TO RELATED APPLICATIONS

A claim for priority under 35 U.S.C. § 119 is made to Korean Patent Application No. 10-2016-0135827 filed on Oct. 19, 2016, in the Korean Intellectual Property Office, the entire contents of which are hereby incorporated by reference.

BACKGROUND

Embodiments of the inventive concept described herein relate to an apparatus and a method for cleaning a component of a substrate processing apparatus.

A variety of processes, such as photolithography, etching, thin-film deposition, ion implantation, cleaning, and the like, are performed to manufacture semiconductor devices. Among these processes, etching, thin-film deposition, ion implantation, and cleaning processes use dry processing apparatuses using gases.

In general, dry processing is performed in an airtight substrate processing apparatus. The substrate processing apparatus includes various components, such as a chamber, a substrate support unit, a gas supply unit, a door for opening or closing the chamber, and the like.

During or after dry processing, a large amount of process gas remains on the components. As the dry processing is performed a plurality of times, a large amount of process gas is deposited on the components to act as a contaminant that contaminates a substrate. In the case where a large amount of contaminant is deposited on surfaces of the components, a processing space for a substrate may be uneven, and holes may be blocked. Furthermore, in the case where a contaminant is deposited on a surface of the substrate support unit on which a substrate is seated, the substrate may be abnormally seated on the substrate support unit, which may cause a failure in substrate processing.

Due to this, maintenance is performed to clean the components after the dry processing is performed a plurality of times. In the maintenance, the components are treated with chemicals. The chemicals may be solutions having properties of strong acid, such as sulfuric acid or nitric acid.

Figure 1:
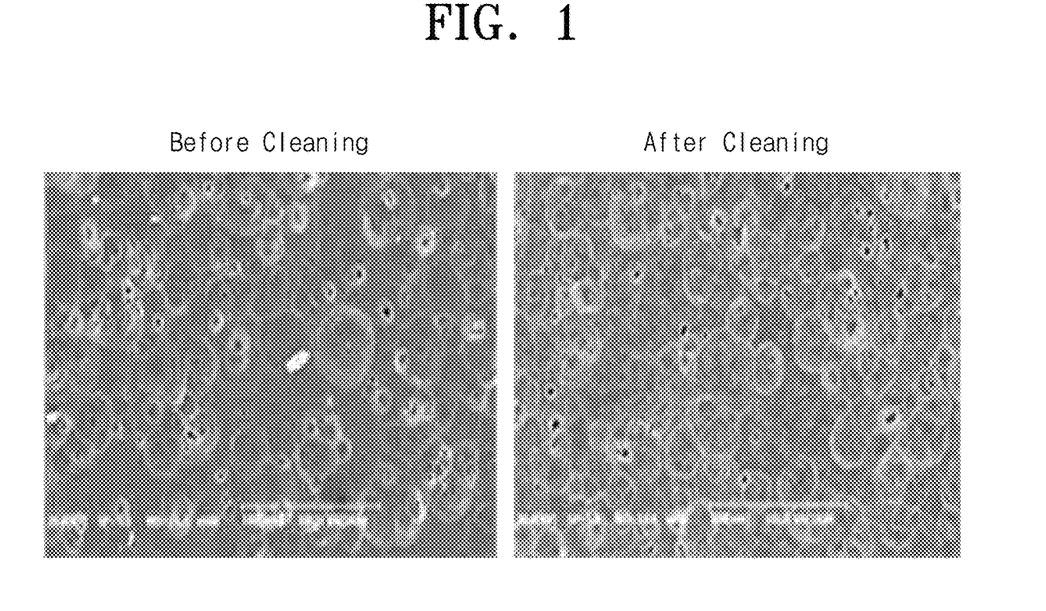
FIG. 1 illustrates data obtained by photographing a component before and after cleaning in a process of treating the component with chemicals.
Figure 2:
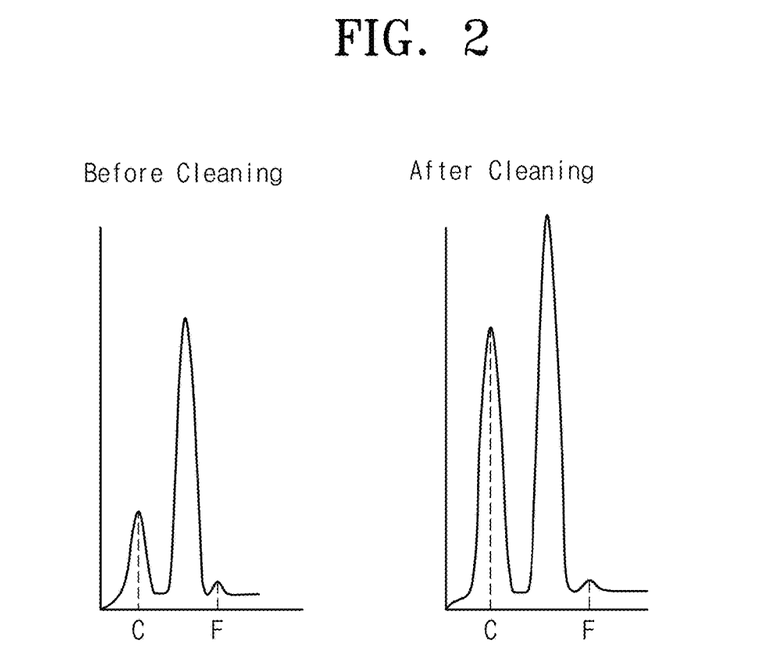
FIG. 2 illustrates graphs obtained before and after the cleaning in the process of treating the component with the chemicals.

FIG. 1 illustrates data obtained by photographing a component before and after cleaning in a process of treating the component with chemicals. FIG. 2 illustrates graphs obtained before and after the cleaning in the process of treating the component with the chemicals. Referring to FIGS. 1 and 2, after being compared with before the cleaning, the component had a larger amount of carbon (C) content, and a content to act as a contaminant was further increased. Moreover, while a fluorine (F) content deposited on the component was reduced, the fluorine (F) was not completely removed, and efficiency in removing the fluorine (F) was insignificant.

This treatment method using chemicals has difficulty in completely removing a contaminant deposited on a component. Also, a surface of the component may be damaged by chemicals. In addition, in the case where a component is cleaned with chemicals, a large amount of waste fluid may be generated, and environment stability and much cost are required to treat the waste fluid.

SUMMARY

Embodiments of the inventive concept provide a method for enhancing efficiency in cleaning a component of a substrate processing apparatus.

Embodiments of the inventive concept provide an apparatus and a method for cleaning a component of a substrate processing apparatus. According to an aspect of an embodiment, a method for cleaning a component of an apparatus that performs dry processing on a substrate includes dipping the component in a cleaning solution received in a cleaning bath, generating radicals from the cleaning solution, and cleaning the component with the radicals.

The cleaning solution may include ozone water, and the radicals may include hydrogen radicals ($H_2^*$) and hydroxyl radicals ($OH^*$). The generating of the radicals may include emitting light toward the cleaning solution. The light may include UV light. The radicals may remove a contaminant adhering to a surface of the component, and the contaminant may include carbon (C) and fluorine (F). The dry processing may include processing the substrate by using plasma. The component may be formed of a material including ceramic. The component cleaning method may be performed outside the apparatus after the component is separated from the apparatus.

According to another aspect of an embodiment, an apparatus for cleaning a component of an apparatus that performs dry processing on a substrate includes a cleaning bath having a receiving space in which the component is received, a solution supply line that supplies a cleaning solution into the receiving space, and a radical generation unit that generates radicals from the cleaning solution.

The radical generation unit may include a light-emitting member that emits light toward the cleaning solution. The light-emitting member and the cleaning bath may be located to overlap each other when viewed from above. The radical generation unit may further include an ozone generator installed in the solution supply line to generate ozone, and the cleaning solution may include ozone water. The cleaning bath may include a body having an open top and having the receiving space inside, an inflow port installed on one side of the body and connected with the solution supply line, and a drain port installed on an opposite side of the body to drain the cleaning solution received in the receiving space. The drain port may be located at a lower position than the inflow port. The component cleaning apparatus may be located outside the apparatus that performs the dry processing on the substrate.

According to embodiments of the inventive concept, a component is cleaned with radicals generated from a cleaning solution. Accordingly, it is possible to enhance efficiency in cleaning the component.

Furthermore, according to embodiments of the inventive concept, a component is cleaned with hydrogen radicals ($H_2^*$) and hydroxyl radicals ($OH^*$) generated from ozone water. Accordingly, it is possible to rapidly remove carbon (C) and fluorine (F) deposited on the component.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

The inventive concept may be embodied in different forms and should not be constructed as limited to the embodiments set forth herein. Rather, these embodiments are provided so that this disclosure will be thorough and complete, and will fully convey the scope of the inventive concept to those skilled in the art. Accordingly, in the drawings, the dimensions of elements are exaggerated for clarity of illustration.

A method of cleaning a component of an apparatus for etching a substrate using plasma will be described in this embodiment. However, the inventive concept is not limited thereto, and various methods of cleaning a component of a substrate processing apparatus may be applied.

Hereinafter, the inventive concept will be described with reference to FIGS. 3 to 7.

Figure 3:
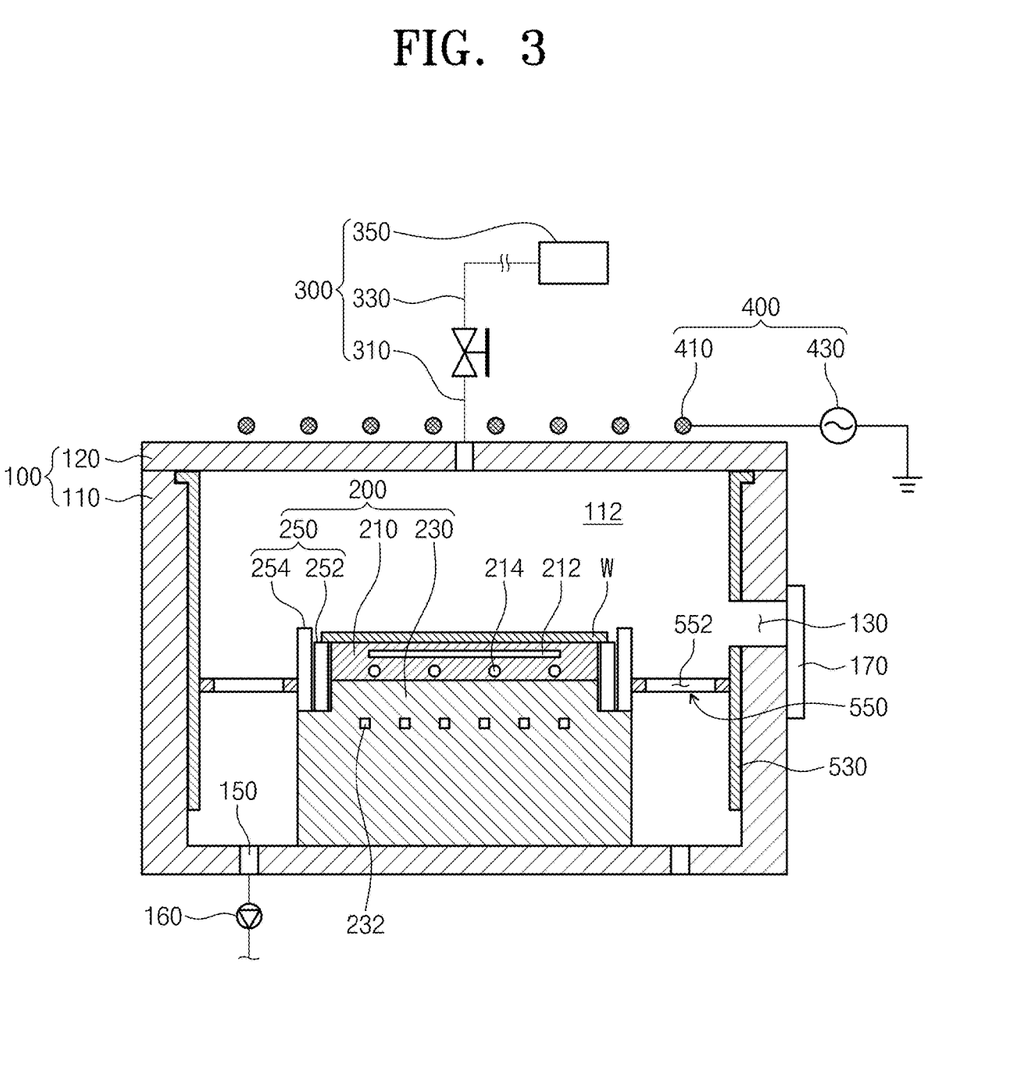
FIG. 3 is a sectional view of a substrate processing apparatus according to an embodiment of the inventive concept.

FIG. 3 is a sectional view of a substrate processing apparatus according to an embodiment of the inventive concept. Referring to FIG. 3, the substrate processing apparatus includes a chamber 100, a substrate support unit 200, a focus ring 250, a gas supply unit 300, a plasma source 400, a liner 530, and a baffle 550.

The chamber 100 has a processing space 112 in which a substrate W is processed. The chamber 100 includes a body 110, a cover 120, and a door 170. The body 110 has a cylindrical shape with an open top. The cover 120 is configured to open or close the top of the body 110. The body 110 has a side exposed to plasma and a side not being exposed to plasma, and the sides are formed of different materials. The inside of the body 110, which is exposed to plasma, is formed of ceramic, and the outside of the body 110, which is not exposed to plasma, is formed of metal. For example, the outside of the body 110 may be formed of aluminum. The cover 120 may be formed of a dielectric material. The body 110 has an exhaust hole 150 formed in the bottom thereof. The exhaust hole 150 is connected to a pressure-reducing member 160 through an exhaust line. The pressure-reducing member 160 applies vacuum pressure to the exhaust hole 150 through the exhaust line. By-products generated during processing are discharged outside the chamber 100 by the vacuum pressure. The body 110 has an opening 130 formed in a side wall thereof. The opening 130 functions as an entrance through which the substrate W is carried into and out of the chamber 100. The opening 130 is formed in a horizontal direction. When viewed from a side, the opening 130 has a slit shape formed in the circumferential direction of the chamber 100.

The door 170 opens or closes the processing space 112. The door 170 is located on the outside of the body 110 so as to be adjacent to the opening 130. The door 170 may move between an opening position and a closing position. Here, the closing position refers to a position at which the door 170 and the opening 130 face each other, and the opening position refers to a position at which the door 170 is away from the closing position.

The substrate support unit 200 supports the substrate W in the processing space 112. The substrate support unit 200 may be an electrostatic chuck 200 that supports the substrate W using electrostatic force. Alternatively, the substrate support unit 200 may support the substrate W by various methods, such as mechanical clamping.

The electrostatic chuck 200 includes a dielectric plate 210 and a base 230. The substrate W is directly placed on the top side of the dielectric plate 210. The dielectric plate 210 has a circular plate shape. The dielectric plate 210 may have a smaller radius than the substrate W. For example, an upper end of the dielectric plate 210 may be located at a height corresponding to the opening 130 of the chamber 100. The dielectric plate 210 has a pin hole (not illustrated) formed in the top side thereof. The dielectric plate 210 may have a plurality of pin holes. For example, the dielectric plate 210 may have three pin holes spaced apart from one another at a constant interval. Lift pins (not illustrated) may be located in the respective pin holes and may move upwards or downwards to lift or lower the substrate W. The dielectric plate 210 has a lower electrode 212 installed therein. The lower electrode 212 is connected to a power supply (not illustrated) and receives electric power from the power supply (not illustrated). The lower electrode 212 applies electrostatic force to the substrate W by using the applied electric power (not illustrated) to clamp the substrate W to the dielectric plate 210. The dielectric plate 210 has a heater 214 installed therein to heat the substrate W. The heater 214 may be located below the lower electrode 212. The heater 214 may have a spiral coil shape. For example, the dielectric plate 210 may be formed of a material including ceramic. The dielectric plate 210 may be formed of a material including alumina ($Al_2O_3$).

The base 230 supports the dielectric plate 210. The base 230 is located below the dielectric plate 210 and is fixedly coupled to the dielectric plate 210. The base 230 has a stepped upper surface, the central region of which is located at a higher position than the outer peripheral region. The central region of the upper surface of the base 230 has an area corresponding to that of the bottom side of the dielectric plate 210. The base 230 has a cooling line 232 formed therein. The cooling line 232 functions as a passage through which cooling gas circulates. The cooling line 232 may be formed in a spiral form within the base 230.

The focus ring 250 concentrates plasma onto the substrate W. The focus ring 250 includes an inner ring 252 and an outer ring 254. The inner ring 252 has an annular shape surrounding the dielectric plate 210. The inner ring 252 is located on the outer peripheral region of the base 230. The upper surface of the inner ring 252 is coplanar with the top side of the dielectric plate 210. The inner peripheral portion of the upper surface of the inner ring 252 supports the outer peripheral region of the bottom side of the substrate W. The outer ring 254 has an annular shape surrounding the inner ring 252. The outer ring 254 is located on the outer peripheral region of the base 230 so as to be adjacent to the inner ring 252. The upper surface of the outer ring 254 is located at a higher position than the upper surface of the inner ring 252. For example, the focus ring 250 may be formed of a material including ceramic. The focus ring 250 may be formed of a material including yttrium oxide ($Y_2O_3$).

The gas supply unit 300 supplies a process gas onto the substrate W supported on the substrate support unit 200. The gas supply unit 300 includes a gas reservoir 350, a gas supply line 330, and a gas inflow port 310. The gas supply line 330 connects the gas reservoir 350 and the gas inflow port 310. A process gas stored in the gas reservoir 350 is supplied to the gas inflow port 310 through the gas supply line 330. A valve is installed in the gas supply line 330 to open or close the passage or to adjust the amount of gas flowing through the passage.

The plasma source 400 excites a process gas in the chamber 100 into plasma. An inductively coupled plasma (ICP) source may be used as the plasma source 400. The plasma source 400 includes an antenna 410 and an external power supply 430. The antenna 410 is disposed above the chamber 100. The antenna 410 has a spiral coil shape wound a plurality of times and is connected with the external power supply 430. The antenna 410 receives electric power from the external power supply 430. The antenna 410 having electric power applied thereto forms a discharge space in the processing space 112 of the chamber 100. The process gas staying in the discharge space may be excited into plasma.

The liner 530 protects the inside wall of the chamber 100. The liner 530 has an annular shape. The liner 530 is located between the substrate support unit 200 and the inside wall of the chamber 100. The liner 530 is located closer to the chamber 100 than the substrate support unit 200. The liner 530 has a side exposed to plasma and a side not being exposed to plasma, and the sides are formed of different materials. For example, the inside of the liner 530, which is exposed to plasma, may be formed of ceramic, and the outside of the liner 530, which is not exposed to plasma, may be formed of metal. The inside of the liner 530 may be formed of a material including yttrium oxide ($Y_2O_3$).

Figure 4:
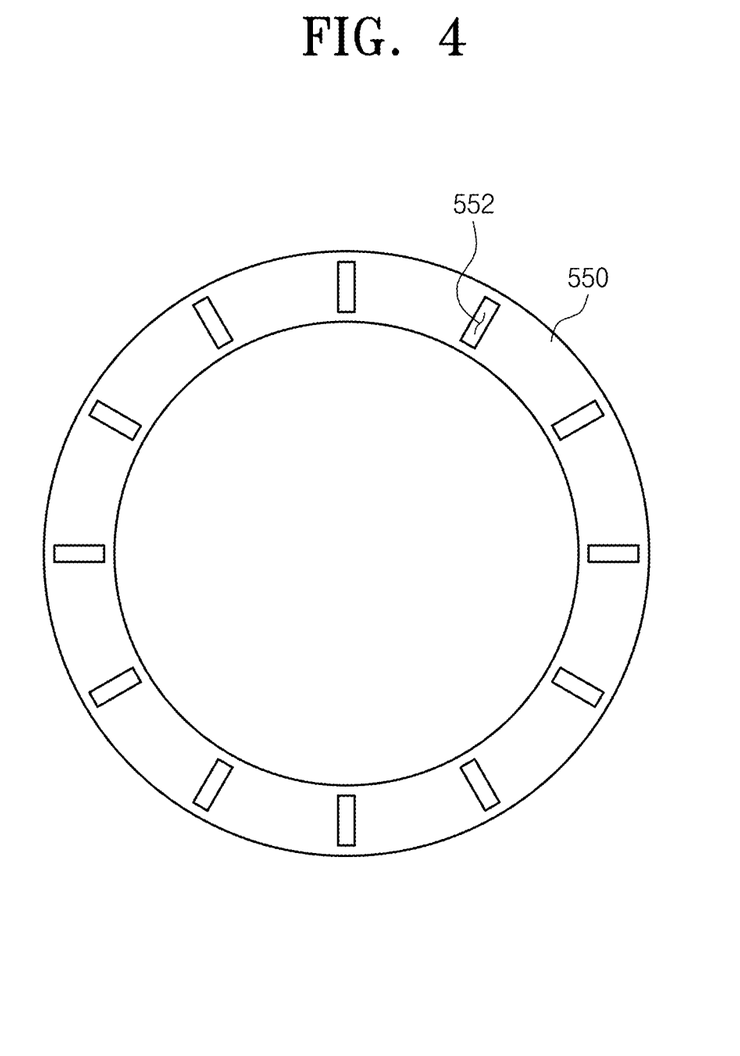
FIG. 4 is a plan view of a baffle illustrated in FIG. 3.

The baffle 550 makes an adjustment to uniformly exhaust the process gas through each region. The baffle 550 has an annular shape. Furthermore, the baffle 550 may have a plate shape. The baffle 550 has a plurality of baffle holes 552 formed therein. The baffle holes 552 are sequentially arranged in the circumferential direction of the baffle 550. The baffle holes 552 have a slit shape oriented in the radial direction of the baffle 550. The baffle holes 552 are spaced apart from one another at the same interval. For example, the baffle 550 may be formed of a material including ceramic. The baffle 550 may be formed of a material including yttrium oxide ($Y_2O_3$).

An apparatus for cleaning a component S of the above-described substrate processing apparatus will be described below. Here, the component S of the substrate processing apparatus may be the cover 120, the substrate support unit 200, the gas supply unit 300, the plasma source 400, the liner 530, or the baffle 550. That is, this embodiment provides an apparatus for cleaning the component S exposed to plasma.

The component S is separated by a worker and then moved into the apparatus for cleaning the component S. The apparatus for cleaning the component S is located outside the substrate processing apparatus. The apparatus for cleaning the component S cleans the component S by using radicals generated from a cleaning solution.

Figure 5:
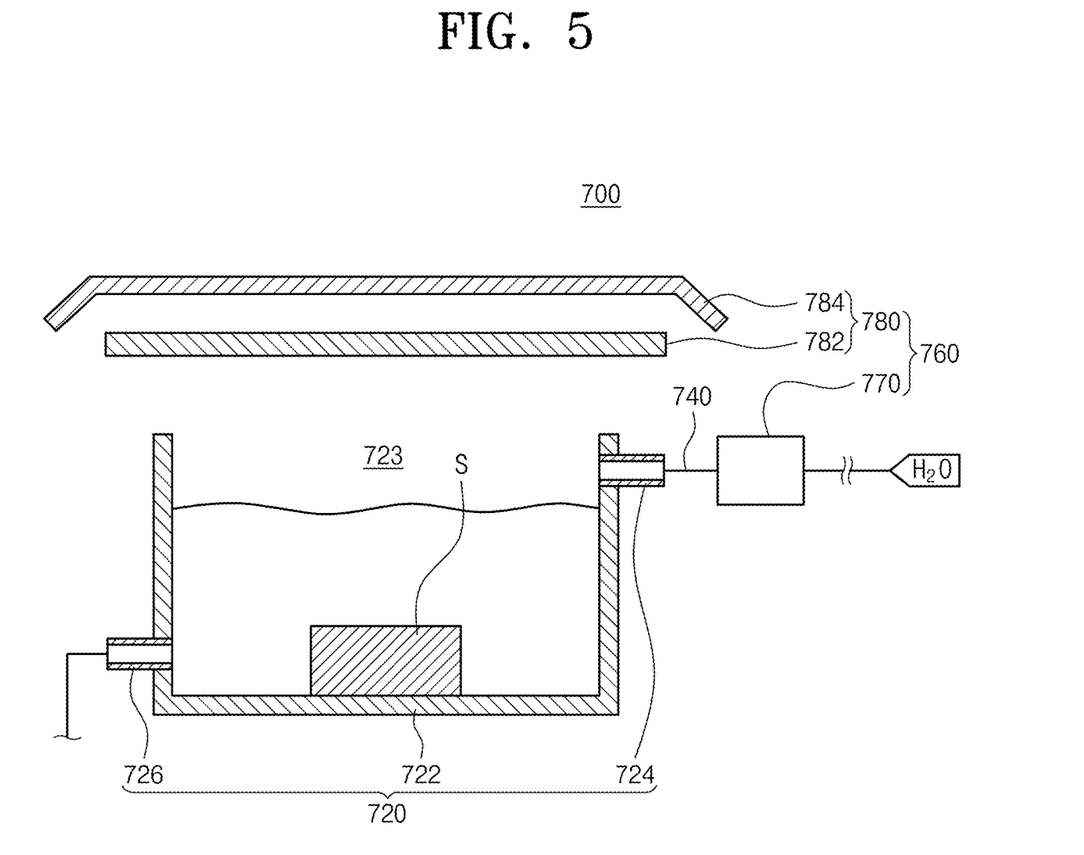
FIG. 5 is a sectional view of an apparatus for cleaning a component of the apparatus illustrated in FIG. 3.
Figure 6:
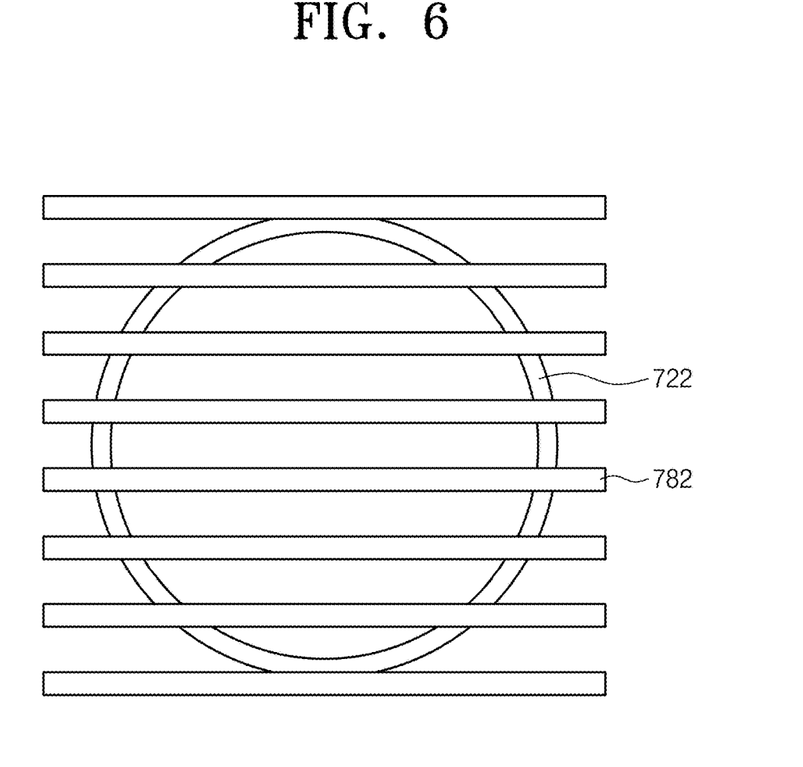
FIG. 6 is a plan view of the component cleaning apparatus illustrated in FIG. 5.

FIG. 5 is a sectional view of an apparatus for cleaning a component of the apparatus illustrated in FIG. 3, and FIG. 6 is a plan view of the component cleaning apparatus illustrated in FIG. 5. Referring to FIGS. 5 and 6, a component cleaning apparatus 700 includes a cleaning bath 720, a solution supply line 740, and a radical generation unit 760. The cleaning bath 720 has a cleaning solution received therein. The cleaning bath 720 includes a body 722, an inflow port 724, and a drain port 726. The body 722 has a cup shape with an open top. The body 722 has a receiving space 723 formed therein to receive the cleaning solution and a component S. The inflow port 724 is installed on one side of the body 722. The inflow port 724 functions as an entrance through which the cleaning solution is supplied into the receiving space 723. The drain port 726 is installed on an opposite side of the body 722. The drain port 726 functions as an exit through which the cleaning solution received in the receiving space 723 is drained. For example, the inflow port 724 may be located at a higher position than the drain port 726.

The solution supply line 740 supplies the cleaning solution into the receiving space 723. The solution supply line 740 is connected to the inflow port 724. For example, the cleaning solution may be DI water including ozone dissolved therein.

The radical generation unit 760 generates radicals from the cleaning solution. The radical generation unit 760 includes an ozone generator 770 and a light-emitting member 780. The ozone generator 770 is installed in the solution supply line 740. The ozone generator 770 generates ozone and dissolves the ozone in DI water flowing through the solution supply line 740. Accordingly, the DI water having ozone dissolved therein may be supplied into the receiving space 723.

The light-emitting member 780 emits light toward the receiving space 723. The light-emitting member 780 generates radicals from the cleaning solution received in the receiving space 723. The light-emitting member 780 is located to face the body 722. When viewed from above, the light-emitting member 780 and the body 722 are located to overlap each other. The light-emitting member 780 may be located above the body 722. The light-emitting member 780 includes a plurality of lamps 782 and a reflector 784. The plurality of lamps 782 are located to face the receiving space 723. The lamps 782 are arranged in one direction. The lamps 782 emit light toward the receiving space 723. For example, the light may be UV light. The light emitted toward the receiving space 723 generates radicals from the cleaning solution.

The reflector 784 is located to face the body 722, with the lamps 782 between the reflector 784 and the body 722. The reflector 784 concentrates light emitted from the lamps 782 on the receiving space 723. For example, the reflector 784 may be formed of a material capable of reflecting light.

A method of cleaning the component S of the above-described substrate processing apparatus will be described below. In the component cleaning method, a dipping step and a cleaning step are performed in a serial order. In the dipping step, the component S is dipped in the cleaning solution with which the cleaning bath 720 is filled. When the component S is dipped in the cleaning solution, light is emitted toward the cleaning solution with which the cleaning bath 720 is filled. The light generates radicals from the cleaning solution, and the radicals remove contaminants deposited on the component S.

Figure 7:
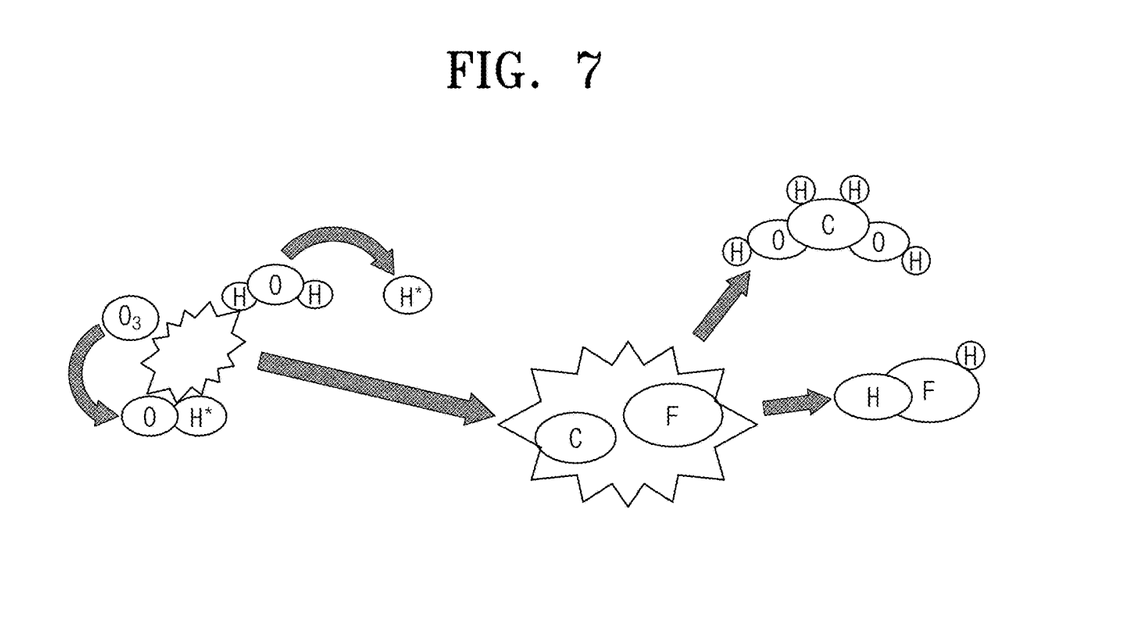
FIG. 7 is a view schematically illustrating a process in which radicals remove contaminants in FIG. 5.

FIG. 7 is a view schematically illustrating a process in which radicals remove contaminants in FIG. 5. Referring to FIG. 7, radicals may react with contaminants deposited on a surface of the component S to remove the contaminants. For example, the radicals may include hydrogen radicals ($H_2^*$) and hydroxyl radicals ($OH^*$), and the hydrogen radicals ($H_2^*$) and the hydroxyl radicals ($OH^*$) may remove the contaminants deposited on the component S. The contaminants may include carbon (C) and fluorine (F).

In the above-described embodiment, it has been described that the cleaning process is performed on the cover 120, the substrate support unit 200, the gas supply unit 300, the plasma source 400, the liner 530, or the baffle 550. However, the cleaning process may be performed on a component S exposed to plasma or a component S of a dry processing apparatus that uses carbon (C) and fluorine (F)

Furthermore, in this embodiment, it has been described that an inductively coupled plasma (ICP) source is used as the plasma source 400. However, a capacitively coupled plasma (CCP) source may also be used as the plasma source 400. The plasma source 400 may have a shower head facing the substrate support unit 200, and the substrate support unit 200 and the shower head may each include an electrode therein. An electric field may be generated between the two electrodes. The shower head may be cleaned by the component (S) cleaning apparatus.

While the inventive concept has been described with reference to embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A method of cleaning a component of an apparatus that performs dry processing on a substrate, the method comprising:
    performing dry processing a plurality of times inside the apparatus with a process gas, which leaves contaminants deposited on a surface of the component of the apparatus, wherein the contaminants include carbon (C) and fluorine (F) and wherein the component is different from the substrate;
    separating the component from the apparatus that performs dry processing on the substrate;
    dipping the component in a cleaning solution in a cleaning bath of a component cleaning apparatus; and
    generating radicals from the cleaning solution whereby the radicals remove the contaminants deposited on the surface of the component.

2. The method of claim 1, wherein the cleaning solution includes ozone water, and
    wherein the radicals include hydrogen radicals ($H_2^*$) and hydroxyl radicals ($OH^*$).

3. The method of claim 1, wherein the generating of the radicals includes:
    emitting light toward the cleaning solution.

4. The method of claim 3, wherein the light includes UV light.

5. The method of claim 1, wherein the dry processing includes processing the substrate by using plasma.

6. The method of claim 1, wherein the component is formed of a material including ceramic.

7. The method of claim 1, wherein the method is performed outside the apparatus that performs dry processing on the substrate, after the component is separated from the apparatus that performs dry processing on the substrate.

8. The method of claim 1, wherein the component of the apparatus that performs dry processing on the substrate is selected from the group consisting of an apparatus cover, a substrate support unit, a gas supply unit, a plasma source, a liner, and a baffle.

* * * * *